United States Patent
Lee

(10) Patent No.: US 11,776,649 B2
(45) Date of Patent: Oct. 3, 2023

(54) METHOD FOR GENERATING AN MEMORY BUILT-IN SELF-TEST ALGORITHM CIRCUIT

(71) Applicant: iSTART-TEK INC., Hsinchu County (TW)

(72) Inventor: Chia Wei Lee, Hsinchu County (TW)

(73) Assignee: ISTART-TEK INC., Hsinchu County (TW)

( * ) Notice: Subject to any disclaimer, the term of this patent is extended or adjusted under 35 U.S.C. 154(b) by 0 days.

(21) Appl. No.: 17/717,928

(22) Filed: Apr. 11, 2022

(65) Prior Publication Data
US 2023/0223093 A1    Jul. 13, 2023

(30) Foreign Application Priority Data
Jan. 10, 2022    (TW) .................................. 111101024

(51) Int. Cl.
*G11C 29/18*    (2006.01)
*G11C 29/36*    (2006.01)
*G11C 29/46*    (2006.01)

(52) U.S. Cl.
CPC .............. *G11C 29/36* (2013.01); *G11C 29/18* (2013.01); *G11C 29/46* (2013.01); *G11C 2029/3602* (2013.01)

(58) Field of Classification Search
CPC ......... G11C 29/36; G11C 29/18; G11C 29/46; G11C 2029/3602
See application file for complete search history.

(56) References Cited

U.S. PATENT DOCUMENTS

| | | | | |
|---|---|---|---|---|
| 10,387,599 | B1 * | 8/2019 | Arora | G11C 29/16 |
| 11,302,413 | B2 * | 4/2022 | Koker | G11C 29/787 |
| 2002/0073374 | A1 * | 6/2002 | Danialy | G01R 31/31724 |
| | | | | 714/738 |

* cited by examiner

*Primary Examiner* — Mohammed A Bashar
(74) *Attorney, Agent, or Firm* — Chun-Ming Shih; HDLS IPR SERVICES

(57) ABSTRACT

A method for generating a memory built-in self-test circuit includes steps of providing an editable file, wherein the editable file configured to be edited by a user to customize a memory test algorithm; performing a syntax parsing on the editable file to obtain the memory test data, wherein the memory test data being corresponding to the memory test algorithm; and generating the memory built-in self-test circuit based on the memory test data.

2 Claims, 5 Drawing Sheets

```
INST_UP {
    N;        ADR_INC;  W(B), N;  ADR_INC;
    N;        ADR_INC;  W(B), N;  ADR_INC;
    N;        ADR_INC;  W(B), N;  ADR_INC;
    N;        ADR_INC;  W(B), N;  ADR_INC;
    N;        ADR_INC;  W(B), N;  ADR_INC;
    N;        ADR_INC;  W(B), N;  ADR_INC;
    ADR_INC;  ADR_INC;  ADR_INC;  ADR_INC;
    W(B), N;  ADR_INC;  N;        ADR_INC;
    W(B), N;  ADR_INC;  N;        ADR_INC;
    W(B), N;  ADR_INC;  N;        ADR_INC;
    W(B), N;  ADR_INC;  N;        ADR_INC;
    W(B), N;  ADR_INC;  N;
    ADR_INC;  ADR_INC;  ADR_INC;  ADR_INC;  //Loop end
}
```

FIG. 1A

```
INST_UP {
  0   N*           ADR_INC:1  W(B), N*    ADR_INC:
  2   N*           ADR_INC:3  W(B), N*    ADR_INC:
  4   N*           ADR_INC:5  W(B), N*    ADR_INC:
  6   N*           ADR_INC:7  W(B), N*    ADR_INC:
  8   N*           ADR_INC:9  W(B), N*    ADR_INC:
  10  N*           ADR_INC:11 W(B), N*    ADR_INC:
  12 ADR_INC:13 ADR_INC:14 ADR_INC:
  ADR_INC:15 ADR_INC:
  16 W(B), N*     ADR_INC:17 N*           ADR_INC:
  18 W(B), N*     ADR_INC:19 N*           ADR_INC:
  20 W(B), N*     ADR_INC:21 N*           ADR_INC:
  22 W(B), N*     ADR_INC:23 N*           ADR_INC:
  24 W(B), N*     ADR_INC:25 N*           ADR_INC:
  26 W(B), N*     ADR_INC:27 N*
  ADR_INC:28 ADR_INC:29 ADR_INC:30 ADR_INC:31 //Loop end
}
```

FIG. 1B

```
case(top_default_SEQ_ADDR[4:0])
  5'd0:  top_default_WMASK = 1'd0;
  5'd2:  top_default_WMASK = 1'd0;
  5'd4:  top_default_WMASK = 1'd0;
  5'd6:  top_default_WMASK = 1'd0;
  5'd8:  top_default_WMASK = 1'd0;
  5'd10: top_default_WMASK = 1'd0;
  5'd12: top_default_WMASK = 1'd0;
  5'd13: top_default_WMASK = 1'd0;
  5'd14: top_default_WMASK = 1'd0;
  5'd15: top_default_WMASK = 1'd0;
  5'd17: top_default_WMASK = 1'd0;
  5'd19: top_default_WMASK = 1'd0;
  5'd21: top_default_WMASK = 1'd0;
  5'd23: top_default_WMASK = 1'd0;
  5'd25: top_default_WMASK = 1'd0;
  5'd27: top_default_WMASK = 1'd0;
  5'd28: top_default_WMASK = 1'd0;
  5'd29: top_default_WMASK = 1'd0;
  5'd30: top_default_WMASK = 1'd0;
  5'd31: top_default_WMASK = 1'd0;
default: top_default_WMASK = 1'd1;
endcase
```

FIG. 2

|  | A1 | A2 | A3 | A4 | A5 |
|---|---|---|---|---|---|
| REPEAT_PAT A | (0000, | 0101, | 1010, | 0011, | 1100); |
| REPEAT_PAT B | (1111, | 1010, | 0101, | 1100, | 0011); |
| REPEAT_PAT C | (0000, | 0101, | 1010, | 0011, | 1100); |
| REPEAT_PAT D | (1111, | 1010, | 0101, | 1100, | 0011); |

FIG. 3

METHOD FOR GENERATING AN MEMORY BUILT-IN SELF-TEST ALGORITHM CIRCUIT

CROSS REFERENCE TO RELATED APPLICATIONS

This application claims priority under 35 U.S.C. § 119(a) to Taiwan Patent Application No. 111101024 filed Jan. 10, 2022, the content of which is incorporated herein by reference in its entirety.

TECHNICAL FIELD

The present invention relates to a method for generating a memory built-in self-test (MBIST) circuit, and particularly to a method for generating an MBIST circuit which allows a user to customize a memory test algorithm.

BACKGROUND

Complex system-on-chip (SoC) designs, such as ASIC chips, often contain large amounts of embedded memory. The embedded memory may be static random access memory (SRAM), dynamic random access memory (DRAM), cache memory, register file, or flash memory. The embedded memory of the SoC chip is arranged inside, so it cannot be easily accessed from the outside for testing. Therefore, memory built-in self-test (MBIST) system located on the SoC is a common method for testing the embedded memory array.

Conventional memory built-in self-test (MBIST) systems and methods for generating test patterns (also referred to as background patterns) include implementing the actual data patterns in logic circuits, storing desired test patterns in read-only memory (ROM), and generating algorithms of the test patterns.

The simplest way to generate test patterns is to incorporate logic circuits into the MBIST controller engine to generate desired test patterns, for example, a checkerboard pattern of ones and zeros, or similar data patterns. However, hardware-controlled designs require hardware connection of logic gates for each required test patterns to the MBIST controller engine, so hardware-controlled MBIST cannot be reprogrammed or redesigned for different test patterns after SoC fabrication.

In addition, the types of memory test algorithms provided by existing products on the market are limited. If a user would like to combine multiple test algorithm behaviors to avoid failure of detection of certain memory errors, there would be repeated testing for some test instructions, resulting in increased testing time and cost.

SUMMARY OF THE INVENTION

In view of the technical problems of the prior art, the present invention provides a method for generating a memory built-in self-test (MBIST) circuit, comprising providing an editable file, wherein the editable file configured to be edited by a user to customize a memory test algorithm; performing a syntax parsing on the editable file to obtain the memory test pattern, wherein the memory test data being corresponding to the memory test algorithm; and generating the MBIST circuit based on the memory test data.

The memory test data may include an address data, an address mask data, a pattern data, or a combination thereof.

According to certain embodiments of the present invention, corresponding to the memory test algorithm, the editable file records the address data which memory cell address to be tested.

According to certain embodiments of the present invention, corresponding to the memory test algorithm, the editable file records the address mask data which a memory cell address not to be tested.

According to certain embodiments of the present invention, corresponding to the memory test algorithm, the editable file records the pattern data having a pattern of data to be written to or read from a memory cell.

The present invention also provides a machine-readable medium, which includes instructions that, when executed by a computing device, cause the computing device to perform operations including the following: performing a syntax parsing on an editable file to obtain a memory test data, wherein the editable file is edited by a user to customize a memory test algorithm, and wherein the memory test data corresponds to the memory test algorithm; and generating an MBIST circuit based on the memory test data.

In certain embodiments of the present invention, the operations further include a preliminary step of providing the editable file to be edited by the user.

According to the present invention, the memory test data may include an address data, an address mask data, a pattern data, or a combination thereof.

According to certain embodiments of the present invention, corresponding to the memory test algorithm, the editable file records the address data which a memory cell address to be tested.

According to certain embodiments of the present invention, corresponding to the memory test algorithm, the editable file records the address mask data which a memory cell address not to be tested.

According to certain embodiments of the present invention, corresponding to the memory test algorithm, the editable file records the pattern data having a pattern of data to be written to or read from a memory cell.

These and other aspects will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The foregoing summary, as well as the following detailed description of the invention, will be better understood when read in conjunction with the appended drawing. In the drawings:

FIG. 1A illustrates an editable file according to one embodiment of the present invention.

FIG. 1B illustrates an address mask data tagging address information according to one embodiment of the present invention.

FIG. 2 illustrates an address mask data according to one embodiment of the present invention.

FIG. 3 illustrates a pattern data according to one embodiment of the present invention.

DESCRIPTION OF THE INVENTION

Figure 4:
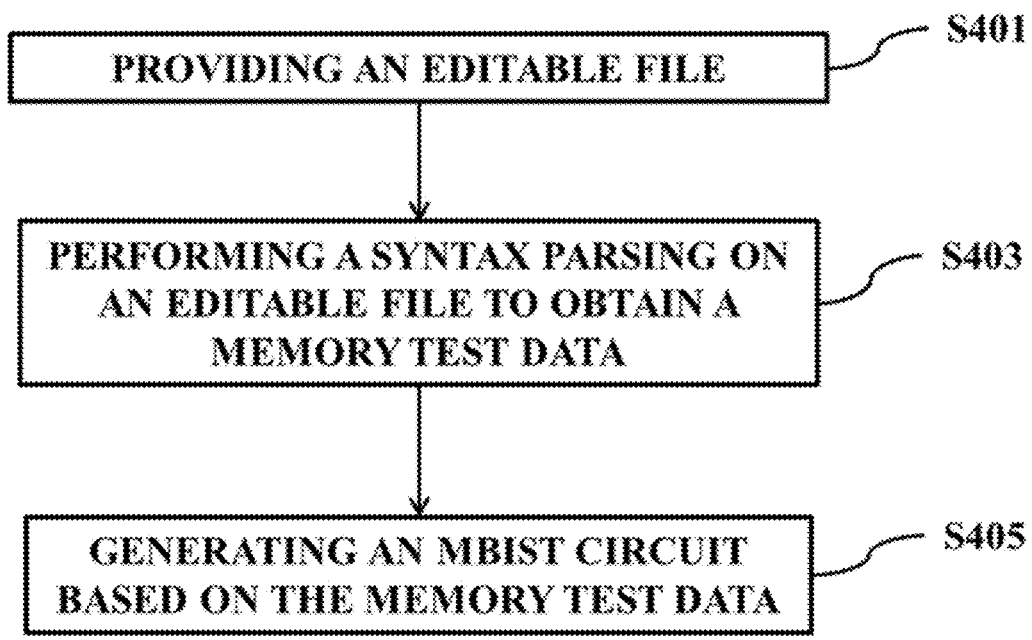
FIG. 4 is a flowchart of a method for generating a memory built-in self-test (MBIST) circuit according to one embodiment of the present invention.

Unless defined otherwise, all technical and scientific terms used herein have the same meaning as commonly understood by a person skilled in the art to which this invention belongs.

As used herein, the singular forms "a", "an", and "the" include plural referents unless the context clearly dictates otherwise. Thus, for example, reference to "a sample" includes a plurality of such samples and equivalents thereof known to those skilled in the art.

In one aspect, the present invention provides a method for generating a memory built-in self-test (MBIST) circuit.

The method comprises providing an editable file, performing a syntax parsing on the editable file to obtain a memory test data, and generating the MBIST circuit based on the memory test data. The generated MBIST circuit may be a design circuit or a physical circuit.

The editable file is edited by a user to customize a memory test algorithm, and the memory test data corresponds to the memory test algorithm. Specifically, the editable file is an editable file of memory test algorithms.

In one embodiment of the present invention, the memory test data may include an address data, an address mask data, a pattern data, or a combination thereof.

Corresponding to the memory test algorithm, the editable file may record the address data which one or more memory cell address to be tested.

Corresponding to the memory test algorithm, the editable file may record the address mask data which one or more memory cell address not to be tested.

Corresponding to the memory test algorithm, the editable file may record the pattern data having one or more pattern of data to be written to one or more memory cell, and/or one or more pattern of data to be read from one or more memory cell.

According to the present invention, the syntax parsing may be embodied through software, firmware, or a combination thereof, but is not limited thereto. For example, the parsing is performed by a parser (software).

In some embodiment of the present invention, the address data is obtained first, subsequently the address mask data, and then the pattern data. However, the present invention is not limited thereto.

According to one embodiment of the present invention, the generated MBIST circuit comprises a data generating unit and an address counting unit.

In another aspect, the present invention provides a machine-readable medium which includes a plurality of instructions.

When executed by a computing device, the plurality of instructions cause the computing device to perform operations including the following: performing a syntax parsing on an editable file to obtain a memory test data, wherein the editable file is edited by a user to customize a memory test algorithm, and wherein the memory test data corresponds to the memory test algorithm; and generating an MBIST circuit based on the memory test data.

The operations may further include a preliminary step of providing the editable file. For example, the editable file may be provided in a cloud space, or via email.

The generated MBIST circuit may be a design circuit or a physical circuit.

The term "machine" may refer to a machine which can operate as a standalone device or can be connected (e.g., networked) to other machines. In a networked deployment, the machine can operate in the capacity of a server machine, a client machine, or both in server-client network environments. The machine may be a personal computer (PC), a tablet PC, a set-top box, a personal digital assistant, a mobile telephone, a web appliance, an IoT device, automotive system, or any machine capable of executing instructions (sequential or otherwise) that specify actions to be taken by that machine. The term "machine" also includes any collection of machines that individually or jointly execute a set (or multiple sets) of instructions to perform any one or more of the methodologies discussed herein, such as cloud computing, software as a service (SaaS), other computer cluster configurations.

According to the present invention, the memory test data may include an address data, an address mask data, a pattern data, or a combination thereof. In one embodiment of the present invention, the test data include an address data, an address mask data, and a pattern data.

The syntax parsing may be embodied through software, firmware, or a combination thereof, but is not limited thereto. In some embodiment of the present invention, the address data is obtained first, subsequently the address mask data, and then the pattern data; however, the present invention is not limited thereto.

According to the present invention, corresponding to the memory test algorithm the editable file may record the address data may which a memory cell address to be tested, corresponding to the memory test algorithm the editable file may record the address mask data which a memory cell address not to be tested, and corresponding to the memory test algorithm the editable file may record the pattern data having a pattern of data to be written to or read from a memory cell.

For example, embodiments of the present invention may be provided as a computer program product or software, which may include one or more machine-readable medium having machine-executable instructions stored thereon. When executed by one or more machines such as a computer, a computer network or other electronic devices, the machine-executable instructions may cause the one or more machines to performed operations as described herein. The machine-readable medium includes but is not limited to a floppy disk, a compact disc, CD-ROMs, and a magneto-optical disc, ROM, RAM, EPROM, EEPROM, a magnetic or optical card, flash memory, or other types of medium/machine-readable media suitable for storing machine-readable instructions.

Further, embodiments of the present invention may also be downloaded as a computer program product, wherein the program may be transferred from a remote computer or electronic device (e.g., a server) to a requesting process (e.g., a user end) by way of data signals embodied in a carrier wave or other propagation medium via a communication link (e.g., a modem or network connection).

The present invention is further illustrated by the following example, which is illustrative rather than restrictive.

Example 1: Method for Generating an MBIST Circuit

An editable file of memory test algorithms is provided to a user to be edited by the user. The syntax supported by the editable file of memory test algorithms are shown in Table 1 below.

TABLE 1

Supported Syntax and Their Functions

| Syntax | Function |
|---|---|
| UP | Count (increase) address from "0" by "+1" |
| DN | Count (decrease) address from a maximum value by "−1" |
| ADD_INC | Depending on UP or DN, count address by "+1" or "−1" |
| N | NOP (No Operation); Do not do read or write operations |
| R(A) | Read data having pattern A |
| W(A) | Write data having pattern A |
| S | Sleep; read or write operation is paused |
| , | Separate subsets of memory test instructions |
| ; | End at a complete memory test instruction operation |

A user may edit the editable file of memory test algorithms to define or customize test behaviors of each memory address. As shown in FIG. 1A and FIG. 1B, the user selects UP, which means that the memory address is counted up from 0, and the user defines whether each address is to perform the behavior of "write data having pattern B (W(B)), followed by doing nothing." Among them, according to FIG. 1B only memory addresses 1, 3, 5, 7, 9, 11, 16, 18, 20, 22, 24, and 26 are subjected to the above-described action, and the rest of the addresses (tagged by "N") are subjected to. Therefore, a mask circuit is generated accordingly to mask out the non-acting parts (see FIG. 2).

In addition, in terms of data patterns, the conventional algorithms can only test one data pattern at a time, but with the method of the present invention, different data patterns can be tested at one time. As shown in FIG. 3, "A" has 5 sets of data patterns, and correspondingly, "B", "C", and "D" each has 5 groups of data patterns. A user may define the data patterns to be tested, and each test will only test one group of data patterns.

Referring to FIG. 4, in the present example, an editable file is first provided (step S401). A user may edit the editable file to customize/define one or more memory test algorithms. Subsequently, a syntax parsing is performed to the editable file edited by the user to obtain a memory test data (step S403). Step 403 may be embodied through software. The memory test data comprises an address data, an address mask data, and a pattern data. Lastly, an MBIST circuit is generated based on the memory test data (step S405), and the MBIST circuit is used for testing.

It is believed that a person of ordinary knowledge in the art where the present invention belongs can utilize the present invention to its broadest scope based on the descriptions herein with no need of further illustration. Therefore, the descriptions and claims as provided should be understood as of demonstrative purpose instead of limitative in any way to the scope of the present invention.

The invention claimed is:

1. A method for generating a memory built-in self-test circuit, comprising:
   providing an editable file; wherein the editable file configured to be edited by a user to customize a memory test algorithm, the editable file includes an address data, an address mask data, and a pattern data;
   performing a syntax parsing on the editable file to obtain the address data which more memory cells to be tested;
   performing the syntax parsing on the editable file to obtain the address mask data which one or memory cells among the memory cells defined by the address data not to be tested;
   performing the syntax parsing on the editable file to obtain the pattern data having a pattern of data to be written to or read from the memory cells;
   generating the memory test data according to the address data, the address mask data, and the pattern data, wherein the memory test data corresponds to the memory test algorithm; and
   generating the memory built-in self-test circuit based on the memory test data.

2. A machine-readable medium, which includes instructions that, when executed by a computing device, cause the computing device to perform operations including the following:
   providing an editable file; wherein the editable file configured to be edited by a user to customize a memory test algorithm, the editable file includes an address data, an address mask data, and a pattern data;
   performing a syntax parsing on the editable file to obtain the address data which more memory cells to be tested;
   performing the syntax parsing on the editable file to obtain the address mask data which one or memory cells among the memory cells defined by the address data not to be tested;
   performing the syntax parsing on the editable file to obtain the pattern data having a pattern of data to be written to or read from the memory cells;
   generating the memory test data according to the address data, the address mask data, and the pattern data, wherein the memory test data corresponds to the memory test algorithm; and
   generating the memory built-in self-test circuit based on the memory test data.

* * * * *